United States Patent
Meier et al.

(10) Patent No.: US 6,653,055 B1
(45) Date of Patent: Nov. 25, 2003

(54) METHOD FOR PRODUCING ETCHED CIRCUITS

(75) Inventors: Kurt Meier, Therwil (CH); Ulrich Lacher, Inzlingen (DE)

(73) Assignee: Vantico, Inc., Brewster, NY (US)

( * ) Notice: Subject to any disclaimer, the term of this patent is extended or adjusted under 35 U.S.C. 154(b) by 0 days.

(21) Appl. No.: 09/787,220

(22) PCT Filed: Sep. 9, 1999

(86) PCT No.: PCT/EP99/06618

§ 371 (c)(1), (2), (4) Date: Mar. 16, 2001

(87) PCT Pub. No.: WO00/18199

PCT Pub. Date: Mar. 30, 2000

(30) Foreign Application Priority Data

Sep. 18, 1998 (CH) ................................. 1912/98

(51) Int. Cl.[7] ................................. G03C 5/00
(52) U.S. Cl. ............ 430/313; 430/318; 216/17; 216/41; 427/97; 427/98
(58) Field of Search ............... 430/313, 315, 430/314, 318; 216/17, 13, 41; 427/58, 96, 97, 98

(56) References Cited

FOREIGN PATENT DOCUMENTS

| DE | 3732249 A1 | 4/1989 |
|---|---|---|
| EP | 0 204 415 A2 | 12/1986 |
| FR | 1.445.569 | 6/1966 |
| GB | 830187 | 3/1960 |
| WO | WO 87/07980 | 12/1987 |

OTHER PUBLICATIONS

H. Schwab "Electrodeposition of Photoresists for Printed Wiring Board Application An Answer to Fine Line Requirements and Lower processing Costs" Ciba–Geiby, Switzerland pp. 1–7–1A–1–7–14A.

M. Hummel "Einführung in die Leiterplattentechnologie" [Introduction to printed circuit board technology], pp. 98–100, Eugene G. Lenzer Verlag AG 1991.

*Primary Examiner*—Kathleen Duda
(74) *Attorney, Agent, or Firm*—Proskauer Rose LLP

(57) ABSTRACT

Two sided printed circuit boards with very small rings surrounding the plated though holes can be produces by starting with a through-plated copper laminate, and coating it with a liquid negative electrodeposition photo-resist. The coated photo-resist is exposed to light through a mask set up so that the light does not shine on the through-platings. The non-crosslinked photo-resist is subsequently removed. A metal or a metal alloy resist is laid down by electrodeposition on those surfaces from which the non-crosslinked photo-resist has been removed. Finally, the crosslinked photoresist material is removed and the exposed copper laminate is treated with a copper-etching solution to completely remove the copper surface that has been uncovered.

15 Claims, 1 Drawing Sheet

METHOD FOR PRODUCING ETCHED CIRCUITS

The present invention relates to a method for producing printed circuit boards having through-platings.

In structuring through-plated copper laminates, protecting the holes from the etching medium is a problem. To solve that problem, M. Hummel: "Einführung in die Leiterplattentechnologie" [Introduction to printed circuit board technology], pages 98–100, Eugen G. Lenze Verlag AG (1991) proposes the "tenting technique", wherein a solid film (dry film resist) laid down over the holes like a tent acts as an etching resist. It is, however, a disadvantage of that method that annular rings of copper are produced around the through-platings, which limits the wiring density of the printed circuit board. According to H. Schwab: "Electrodeposition of Photoresists for Printed Wiring Board Application", EIPC Winter Conference 1992, such annular rings can be reduced or even entirely eliminated when a positive photoresist applied by electrical immersion coating (electrodeposition) is used as the etching resist. The positive photoresists customarily used in the art require relative long light-exposure times, however. Moreover, electrical immersion coating is associated with significant technical cost.

The aim of the present invention was to develop a less costly method for structuring through-plated inner and outer layers.

It has now been found that, when a liquid negative electrodeposition-resist is used, the formation of annular rings can be significantly reduced or entirely avoided.

The present invention relates to a method for producing printed circuit boards having through-platings, which comprises the following method steps:

(A) coating both sides of a through-plated copper laminate using a negative electrodeposition-resist;

(B) structuring the resist coating by imagewise exposure to light, the through-platings being covered by a mask, and then developing;

(C) applying a metal resist by electrodeposition;

(D) removing the crosslinked negative photoresist remaining on the laminate;

(E) removing the bare copper by means of an etching solution; and (F) removing the metal resist by means of a stripper solution.

The invention is illustrated by the accompanying drawings.

Figure 1:
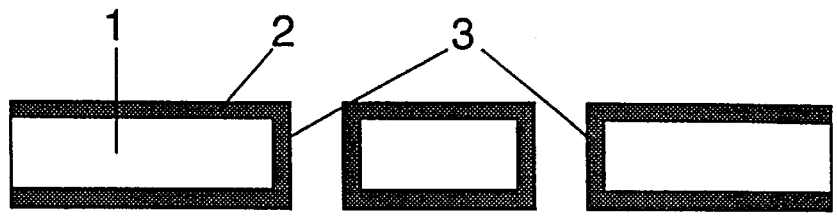

FIG. 1 shows a copper laminate (inner or outer layer having through-platings 3) which, in method step (A), is coated with a liquid negative photoresist by means of customary methods, for example spin-coating, immersion, knife coating, curtain pouring, screen-printing, brush application, spraying, electrostatic spraying or roller coating.

Copper laminates generally consist of an insulating substrate (1, FIG. 1), which is coated on both sides with a thin copper foil (2, FIG. 1, coating thickness about from 10 to 50 $\mu$m). Glass-fibre-reinforced epoxy resins, especially epoxy resins provided with suitable flame protection agents, are preferably used as the insulating substrate for copper laminates (FR-4 laminates).

The laminate is preferably coated by means of roller coating or screen-printing.

Where appropriate, the solvent is subsequently removed by drying in a circulating-air oven or an infra-red oven. The thickness of the dried photo-sensitive coating (4, FIG. 2) so applied is advantageously from 3 to 30 $\mu$m, preferably from 5 to 15 $\mu$m.

In method step (B), in accordance with known methods, the coated laminate is exposed to light through a mask corresponding to the structure to be applied, the resist composition being cured on the surface regions to be removed later. Where appropriate, subsequent thermal curing is carried out after method step (B) for the purpose of completely crosslinking the polymers in the resist composition.

Figure 2:
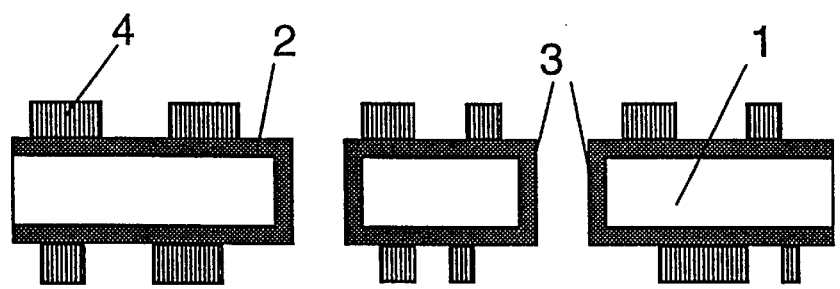

The non-crosslinked polymer is removed by treatment with a solvent, preferably water or aqueous alkali solution, in accordance with known methods (FIG. 2).

Figure 3:
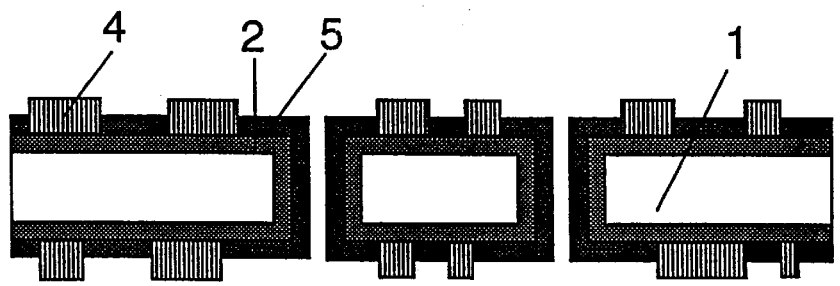

Then, in method step C, using known methods, a metal resist (5, FIG. 3) is laid down by electrodeposition on those surface regions from which the photopolymer was removed by developing.

Preferred metal resists are tin, nickel, lead, silver, gold or an alloy comprising one of those metals. Special preference is given to tin.

In method step D, the crosslinked photoresist material still remaining on the board is removed by treatment with a suitable solvent (stripping), preferably aqueous sodium hydroxide solution or potassium hydroxide solution, where appropriate at elevated temperature.

Figure 4:
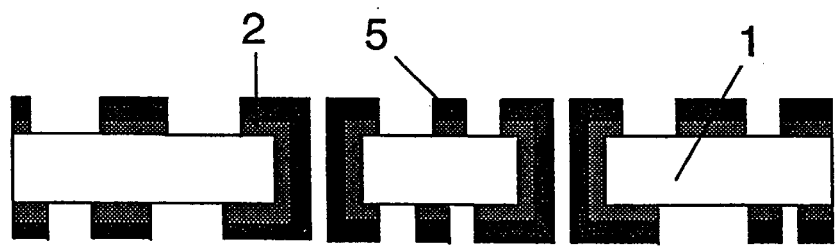

The laminate is then treated with a copper-etching solution, for example a solution of $Cu(NH_3)_4Cl_2$, $KMnO_4$ or $(NH_4)_2S_2O_8$, the copper surfaces that have been uncovered being completely removed (FIG. 4).

Figure 5:
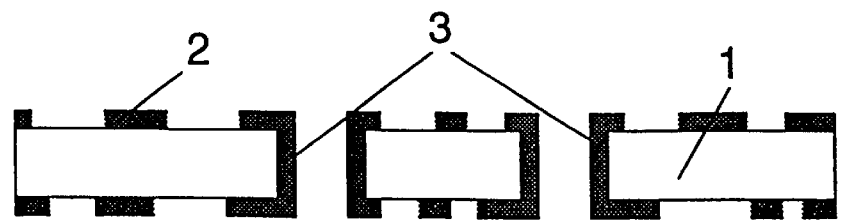

Then, in the final process step, the protected copper conductors and through-platings are cleared of metal resist. This is carried out in accordance with known methods by treatment with a suitable stripper solution that attacks and dissolves the metal of the resist but not the copper (FIG. 5). Suitable stripper solutions generally comprise dilute acids, for example hydrochloric acid or tetrafluoroboric acid.

Where appropriate, the metal resist may also be left on the copper. When tin is used as the metal resist, a heating step is preferably carried out subsequently, resulting in the tin's melting around the regions of copper, thereby enveloping them.

By this means, there is obtained a double-sided printed circuit board having through-platings which may have no, or only very small, annular rings.

EXAMPLE 1

A 0.3 mm-thick, non-structured inner layer with through-platings of 0.25 mm is coated with Probimage® 1020 (negative resist, Ciba Specialty Chemicals) by means of a roller coater. The coating is then dried for 5 minutes at 80° C. in a circulating-air oven. A resist coating thickness of 11 mm is achieved by that means. Both sides are then exposed to light through a photo-mask containing a positive image of the conductor configuration to be produced; the photo-mask covers the through-platings, which have a diameter of 0.25 mm, with a patch 0.3 mm in diameter. The light-exposure energy is 150 mJ/cm$^2$. After dissolving away (developing) the non-crosslinked coating using 1% sodium carbonate solution in a spray developer at 2 bar, 35° C. for 40 seconds, rinsing with deionised water and hot-air drying, the plate is immersed in a bath for tin electrodeposition. In the acidic tin bath, a coating about 8 mm thick is built up by cathodic deposition at the developed locations. In the next step, the photo-crosslinked Probimage® 1020 is treated with 3% potassium hydroxide solution at 60° C. in a spraying apparatus (spray pressure 3 bar) and removed from the board. The regions of copper that are uncovered are then etched away using ammoniacal copper(II) chloride solution. The board is rinsed with deionised water and, in the final step, the tin is removed using an acid stripper solution. There is obtained an inner layer which has through-platings with only small residual rings, the ring thickness being 0.025 mm. The through-platings show no sign of any etching.

What is claimed is:

1. A method for producing double-sided printed circuit boards having through-platings, the method comprising the steps of:

(A) coating both sides of a through-plated copper laminate using a negative photo-resist;

(B) exposing selected portions of both sides of the photo-resist to light through a mask, wherein the through-platings and small regions surrounding the through-platings are not exposed to light;

(C) removing portions of the photo-resist coating that were not exposed to light in step (B);

(D) applying etch-resist to the through-plated copper laminate-by electrodeposition wherein the etch-resist is a metal or a metal alloy;

(E) removing portions of the photo-resist coating that were exposed to light in step (B), so as to uncover underlying copper;

(F) removing copper from portions of the through-plated copper laminate that are not protected by the etch-resist so that only very small rings of copper or no rings of copper remain around the through-platings; and (G) removing the etch-resist.

2. The method of claim 1, wherein the small region is about 0.05 mm wide.

3. The method of claim 1, wherein the small region is an annular ring that is about 0.05 mm wide.

4. The method of claim 1, wherein the small region is an annular ring with an outer diameter of about 0.3 mm.

5. The method of claim 1, wherein the very small ring of copper is about 0.025 mm wide.

6. The method of claim 1, wherein the very small ring of copper is less than about 0.025 mm wide.

7. A method for producing double-sided printed circuit boards having through-platings, the method comprising the steps of:

(A) applying etch-resist to a through-plated copper laminate by electrodeposition in a pattern that includes small annular rings around the through-platings of the copper laminate;

(B) removing copper from portions of the through-plated copper laminate that are not protected by the etch-resist that was applied in step (A) so that either very small rings of copper or no rings of copper remain around the through-platings; and (C) removing the etch-resist.

8. The method of claim 7, wherein the etch-resist is a metal or a metal alloy.

9. The method of claim 7, wherein the small annular rings are about 0.05 mm wide.

10. The method of claim 7, wherein the small annular rings have an outer diameter of about 0.3 mm.

11. The method of claim 7 wherein the etch-resist is a metal or a metal alloy, and the small annular rings are about 0.05 mm wide and have an outer diameter of about 0.3 mm.

12. The method of claim 7, wherein the very small rings of copper are about 0.025 mm wide.

13. The method of claim 7, wherein the very small rings of copper are less than about 0.025 mm wide.

14. The method of claim 7 wherein the etch-resist is a metal or a metal alloy, and the small annular rings are about 0.05 mm wide, and the very small rings of copper are about 0.025 mm wide.

15. The method of claim 7 wherein the etch-resist is a metal or a metal alloy, and the small annular rings are about 0.05 mm wide, and the very small rings of copper are less than about 0.025 mm wide.

* * * * *